(12) United States Patent
Otsubo et al.

(10) Patent No.: US 11,646,273 B2
(45) Date of Patent: May 9, 2023

(54) MODULE

(71) Applicant: Murata Manufacturing Co., Ltd., Kyoto (JP)

(72) Inventors: Yoshihito Otsubo, Kyoto (JP); Hideki Shinkai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/205,052

(22) Filed: Mar. 18, 2021

(65) Prior Publication Data

US 2021/0225779 A1    Jul. 22, 2021

Related U.S. Application Data

(63) Continuation of application No. PCT/JP2019/039163, filed on Oct. 3, 2019.

(30) Foreign Application Priority Data

Oct. 5, 2018  (JP) .............................. JP2018-190262

(51) Int. Cl.
  *H01L 23/552*   (2006.01)
  *H01L 21/56*   (2006.01)
  (Continued)

(52) U.S. Cl.
  CPC ............ *H01L 23/552* (2013.01); *H01L 21/56* (2013.01); *H01L 25/0655* (2013.01); *H01L 25/18* (2013.01)

(58) Field of Classification Search
  None
  See application file for complete search history.

(56) References Cited

U.S. PATENT DOCUMENTS

2013/0271928 A1   10/2013   Shimamura et al.
2017/0301628 A1   10/2017   Kawabata et al.
(Continued)

FOREIGN PATENT DOCUMENTS

CN   107535078 A   1/2018
JP   2013-222829 A   10/2013
(Continued)

OTHER PUBLICATIONS

International Search Report for PCT/JP2019/039163 dated Nov. 19, 2019.
Written Opinion for for PCT/JP2019/039163 dated Nov. 19, 2019.

*Primary Examiner* — Long Pham
(74) *Attorney, Agent, or Firm* — Pearne & Gordon LLP

(57) ABSTRACT

A module (101) is provided with a substrate including a principal surface (1u), a plurality of electronic components (41, 42, and 43) arranged on the principal surface (1u), a sealing resin (3) covering the principal surface (1u), a ground electrode arranged on the principal surface (1u), a conductive layer (6) covering the sealing resin (3), and a magnetic member (5). The conductive layer (6) is electrically connected to the ground electrode by a plurality of connecting conductors (62) arranged so as to penetrate the sealing resin (3), and the magnetic member (5) includes a magnetic member plate-shaped portion arranged so as to cover the sealing resin (3) and a magnetic member wall-shaped portion (52) arranged in a wall shape in the sealing resin (3). The magnetic member wall-shaped portion (52) is longer than each of the connecting conductors (62).

11 Claims, 14 Drawing Sheets

(51) Int. Cl.
*H01L 25/065* (2023.01)
*H01L 25/18* (2023.01)

(56) References Cited

U.S. PATENT DOCUMENTS

| | | | |
|---|---|---|---|
| 2018/0077829 A1* | 3/2018 | Yamamoto | ............... B32B 7/12 |
| 2018/0092257 A1 | 3/2018 | Otsubo et al. | |
| 2019/0273312 A1 | 9/2019 | Otsubo | |
| 2019/0363055 A1 | 11/2019 | Yazaki et al. | |

FOREIGN PATENT DOCUMENTS

| | | |
|---|---|---|
| JP | 2017-174949 A | 9/2017 |
| WO | 2016/181954 A1 | 11/2016 |
| WO | 2016/186103 A1 | 11/2016 |
| WO | 2017/179586 A1 | 10/2017 |
| WO | 2018/101384 A1 | 6/2018 |
| WO | 2018/159290 A1 | 9/2018 |

\* cited by examiner

MODULE

CROSS REFERENCE TO RELATED APPLICATION

This is a continuation of International Application No. PCT/JP2019/039163 filed on Oct. 3, 2019 which claims priority from Japanese Patent Application No. 2018-190262 filed on Oct. 5, 2018. The contents of these applications are incorporated herein by reference in their entireties.

BACKGROUND OF THE DISCLOSURE

Field of the Disclosure

The present disclosure relates to a module.

Description of the Related Art

Japanese Patent Application Laid-Open No. 2013-222829 (Patent Document 1) describes that, in a module in which a plurality of electronic components are arranged, a shielding member containing a metal material is provided so that a mounting surface on which the electronic components are mounted is separated into a plurality of regions.

Patent Document 1: Japanese Patent Application Laid-Open No. 2013-222829

BRIEF SUMMARY OF THE DISCLOSURE

In recent years, in a module for use as a communication device, components constituting circuits of a power supply system as well as components for wireless communication are mounted with high density to meet the demand for size reduction. In this case, as the mounting density of the components in the module increases, it is necessary not only to strengthen an electromagnetic shield for suppressing an influence of an electromagnetic wave but also to strengthen a magnetic shield, and therefore a shielding structure satisfying both the electromagnetic shield and the magnetic shield is required. The shielding member described in Patent Document 1 is either a "metal member" functioning as the electromagnetic shield or an "electromagnetic wave absorber containing a soft magnetic material" functioning as the magnetic shield and has only one of the functions.

Therefore, an object of the present disclosure is to provide a module satisfying both an electromagnetic shield and a magnetic shield while securing a mounting area.

In order to achieve the above object, a module according to the present disclosure is provided with a substrate including a principal surface, a plurality of electronic components arranged on the principal surface, a sealing resin covering the principal surface and the plurality of electronic components, a ground electrode arranged on the principal surface, a conductive layer covering the sealing resin, and a magnetic member. The conductive layer is electrically connected to the ground electrode by a plurality of connecting conductors arranged so as to penetrate the sealing resin. The magnetic member includes a magnetic member plate-shaped portion arranged so as to cover the sealing resin and a single magnetic member wall-shaped portion arranged in a wall shape between any of the plurality of electronic components in the sealing resin or a plurality of magnetic member wall-shaped portions intermittently arranged in a wall shape between any of the plurality of electronic components in the sealing resin. When viewed in a direction perpendicular to the principal surface, each of the plurality of connecting conductors includes a portion arranged so as to at least partially overlap with a strip-shaped region virtualized on an extension of the single magnetic member wall-shaped portion or the plurality of magnetic member wall-shaped portions. A length of the single magnetic member wall-shaped portion or any one of the plurality of magnetic member wall-shaped portions is longer than a length of each of the connecting conductors.

According to the present disclosure, it is possible to satisfy both an electromagnetic shield and a magnetic shield while securing a mounting area.

DETAILED DESCRIPTION OF THE DISCLOSURE

Figure 1:
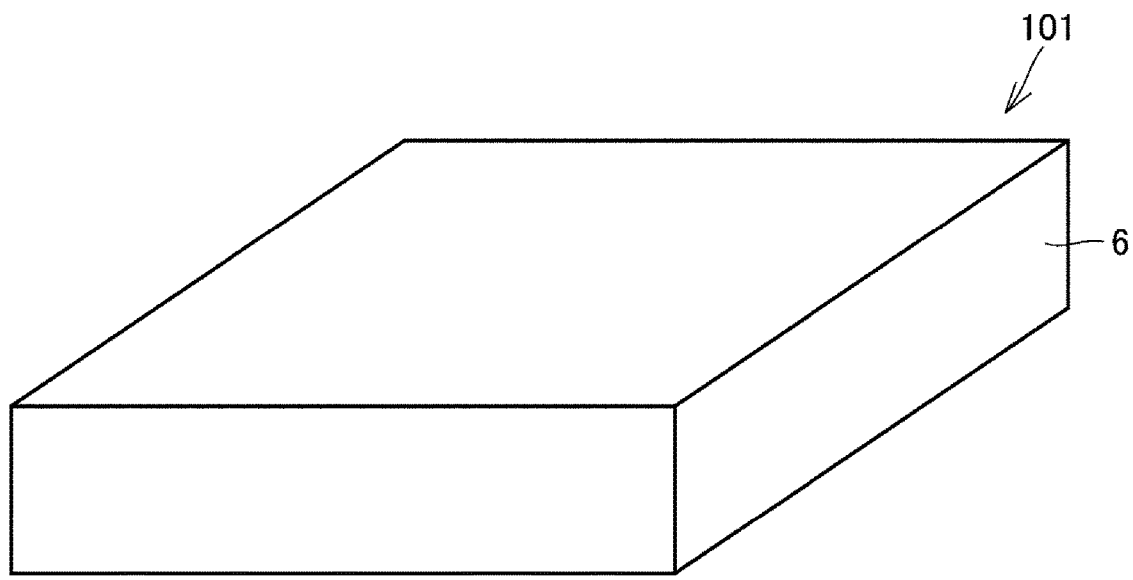
FIG. 1 is a first perspective view of a module according to Embodiment 1 based on the present disclosure.

The dimensional ratios illustrated in the drawings do not necessarily represent an accurate and actual situation, and the dimensional ratios may be exaggerated for convenience of description. In the following description, in a case in which a concept of an upper or lower side is referred to, the upper or lower side does not necessarily mean an absolute upper or lower side and may mean a relative upper or lower side in the illustrated posture.

Embodiment 1

Figure 2:
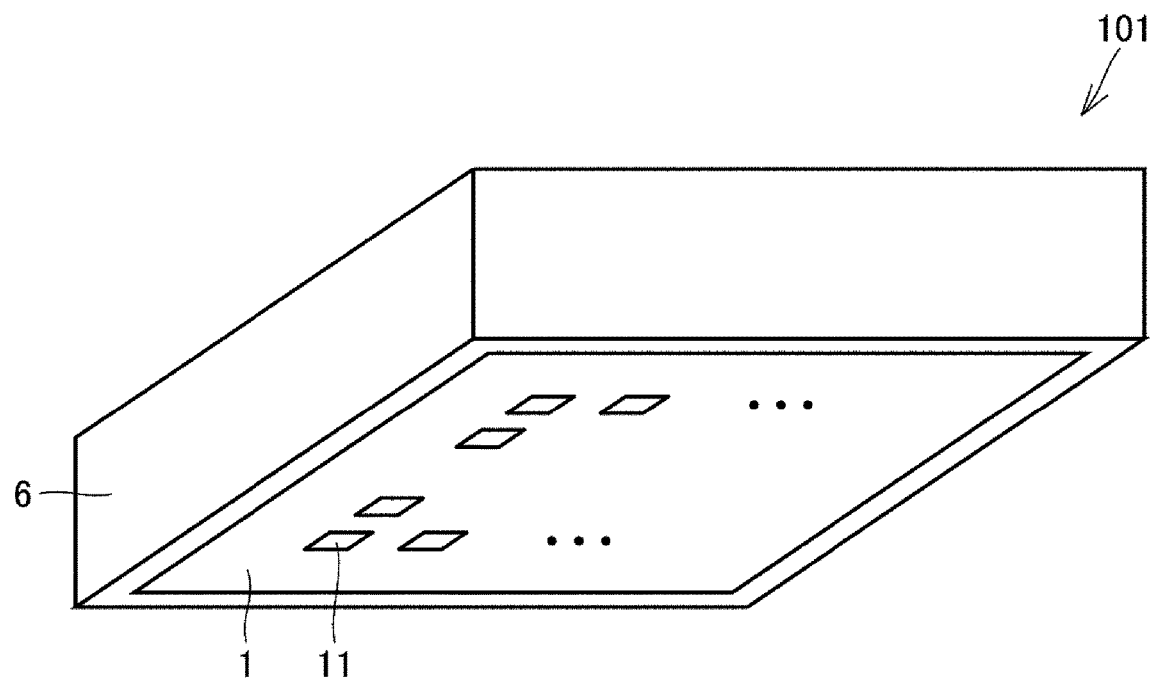
FIG. 2 is a second perspective view of the module according to Embodiment 1 based on the present disclosure.
Figure 3:
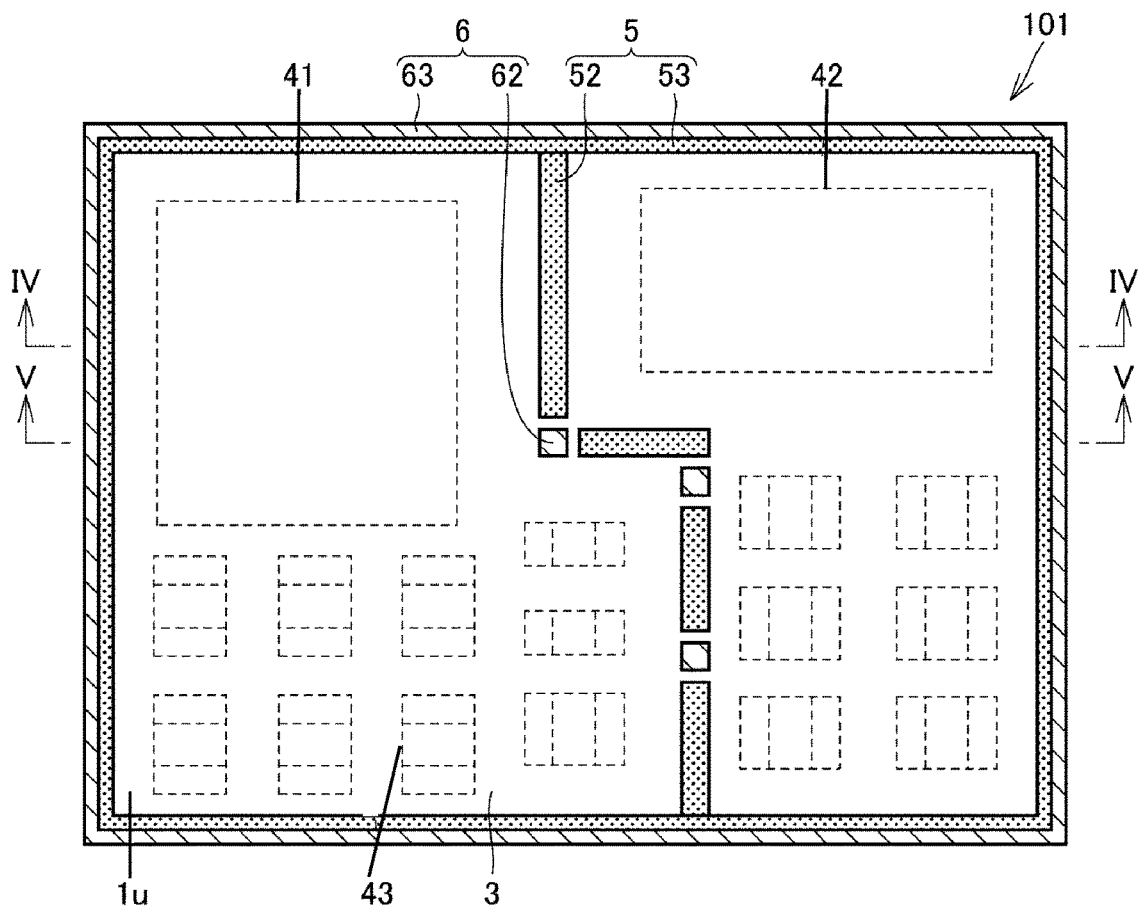
FIG. 3 is a plan view of the module according to Embodiment 1 based on the present disclosure.
Figure 4:
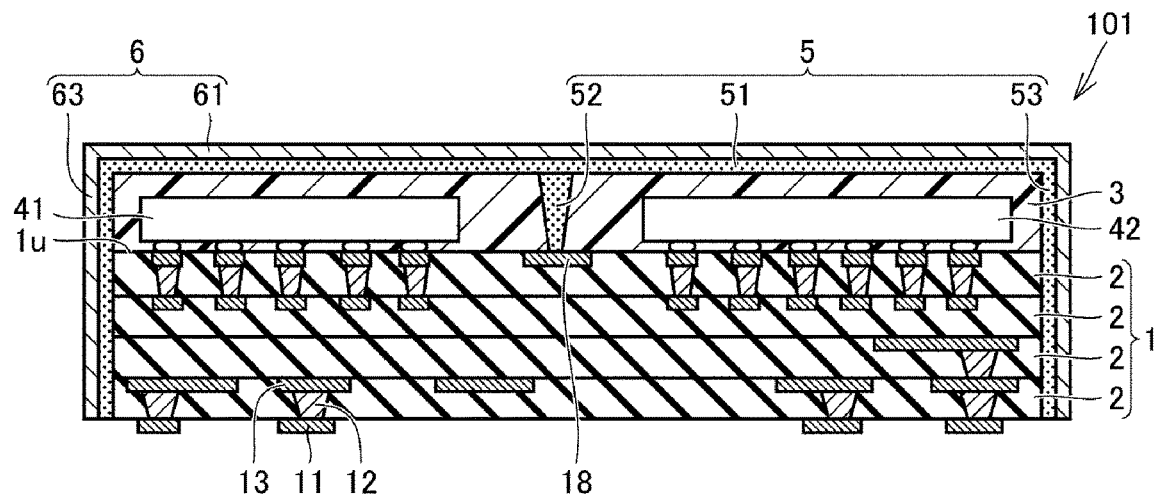
FIG. 4 is a sectional view taken along the line IV-IV in FIG. 3.
Figure 5:
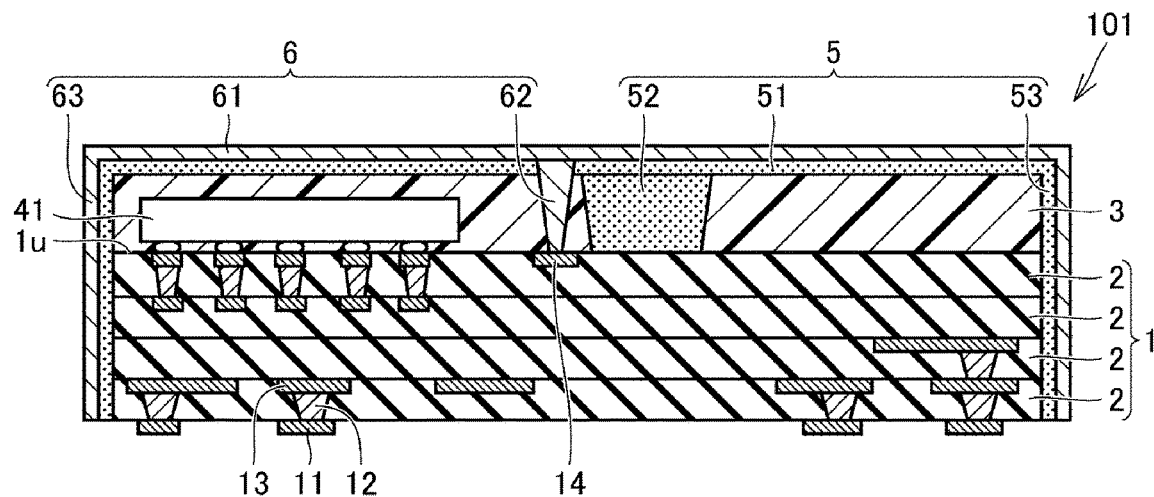
FIG. 5 is a sectional view taken along the line V-V in FIG. 3.

A module according to Embodiment 1 based on the present disclosure will be described with reference to FIGS. 1 to 5. An external view of a module 101 according to the present embodiment is illustrated in FIG. 1. An upper surface and a side surface of the module 101 are covered with a conductive layer 6. The module 101 in FIG. 1 as viewed obliquely from a lower side is illustrated in FIG. 2. A lower surface of the module 101 is not covered with the conductive layer 6 and has a substrate 1 exposed therefrom. A lower surface of the substrate 1 is provided with one or more external connection electrodes 11. The number, size, and arrangement of the external connection electrodes 11 illustrated in FIG. 2 are illustrative only. The substrate 1 may be provided with wires on the surface or inside. The substrate 1 may be a resin substrate or a ceramic substrate. The substrate 1 may be a multilayer substrate. A plan view of the module 101 is illustrated in FIG. 3. FIG. 3 corresponds to a view, viewed from an upper side, of a state in which an upper surface of the conductive layer 6 of the module 101 is removed. A sectional view taken along the line IV-IV in FIG. 3 is illustrated in FIG. 4. Electronic components 41, 42, and 43 are mounted on a principal surface 1u of the substrate 1. The electronic components 41, 42, and 43 are covered with a mold resin 3. The electronic components 41 and 42 may be integrated circuits (ICs), for example. A sectional view taken along the line V-V in FIG. 3 is illustrated in FIG. 5. While, in FIG. 3, the state in which the upper surface of the conductive layer 6 is removed is viewed, FIGS. 4 and 5 are sectional views of a state in which the upper surface of the conductive layer 6 is present. Each of the external connection electrodes 11 is electrically connected to an internal conductor pattern 13 with a conductor via 12 provided so as to penetrate an insulating layer 2 interposed therebetween. As illustrated in FIG. 4, the substrate 1 is a lamination of the plurality of insulating layers 2. The configuration of the substrate 1 illustrated here is illustrative only and is not always the case.

The module 101 according to the present embodiment is provided with the substrate 1 including the principal surface 1u, the plurality of electronic components arranged on the principal surface 1u, the sealing resin 3 covering the principal surface 1u and the plurality of electronic components, a ground electrode 14 arranged on the principal surface 1u, the conductive layer 6 covering the sealing resin 3, and a magnetic member 5. The conductive layer 6 is electrically connected to the ground electrode 14 by a plurality of connecting conductors 62 arranged so as to penetrate the sealing resin 3. The magnetic member 5 includes a magnetic member plate-shaped portion 51 arranged so as to cover the sealing resin 3 and "a single magnetic member wall-shaped portion arranged in a wall shape in the sealing resin 3 or a plurality of magnetic member wall-shaped portions intermittently arranged in a wall shape in the sealing resin 3". "The single magnetic member wall-shaped portion arranged in a wall shape in the sealing resin 3 or the plurality of magnetic member wall-shaped portions intermittently arranged in a wall shape in the sealing resin 3" is hereinbelow referred to as "a magnetic member wall-shaped portion or the like". In FIG. 3, as an example of the magnetic member wall-shaped portion or the like, the module 101 is provided with a plurality of magnetic shield wall-shaped portions 52 intermittently arranged in a wall shape. The plurality of magnetic member wall-shaped portions 52 are arranged in a wall shape between any of the plurality of electronic components. Each of the magnetic member wall-shaped portion 52 may be formed by filling a trench formed in the sealing resin 3 with a magnetic material. The magnetic material to be filled in the trench may be an alloy such as an Fe—Co-based alloy and an Fe—Ni-based alloy or a ferrite material such as NiZn and MnZn, for example. Alternatively, the magnetic material may be made by permalloy plating. The term "permalloy plating" as used herein means plating containing an Ni—Fe alloy. The conductive layer 6 preferably contains metal. The conductive layer 6 preferably contains copper, aluminum, gold, or an alloy containing any of these, for example.

Here, when viewed in a direction perpendicular to the principal surface 1u, each of the plurality of connecting conductors 62 includes a portion arranged so as to at least partially overlap with a strip-shaped region virtualized on an extension of the magnetic member wall-shaped portion or the like. Actually, in FIG. 3, the connecting conductors 62 are arranged so as to almost overlap with the whole strip-shaped region virtualized on an extension of the magnetic member wall-shaped portion 52. The concept of the "strip-shaped region" mentioned here will be described in detail below.

Also, a length of the "single magnetic member wall-shaped portion" or the "any one of the plurality of magnetic member wall-shaped portions" along a longitudinal direction of the strip-shaped region is longer than a length of the adjacent connecting conductor along the longitudinal direction of the strip-shaped region.

That is, in a case in which a dimension in a direction parallel to the principal surface of the substrate is defined as a "length", the length of the magnetic member wall-shaped portion is longer than the length of the connecting conductor.

In the present embodiment, the conductive layer 6 serves as an electromagnetic shield shielding an electromagnetic wave, and the magnetic member 5 serves as a magnetic shield shielding magnetism.

In the present embodiment, since each of the connecting conductors 62 includes a portion arranged so as to at least partially overlap with the virtual strip-shaped region, it is possible to prevent the magnetic member 5 and the conductive layer 6 from being arranged as parallel separate wall-shaped members on the principal surface 1u.

Accordingly, in the present embodiment, it is possible to satisfy both an electromagnetic shield and a magnetic shield while securing a mounting area.

By arranging the plurality of magnetic member wall-shaped portions 52 and the plurality of connecting conductors 62 in the above manner, the plurality of magnetic member wall-shaped portions 52 and the plurality of connecting conductors 62 can be arranged along a desired shape. Therefore, an electromagnetic shield and a magnetic shield for a specific component can be strengthened, for example.

Also, in the present embodiment, by intermittently arranging the magnetic member wall-shaped portions 52 and the connecting conductors 62, it is possible to avoid a structure in which the sealing resin 3 is fully divided, which enables a problem caused by warpage at the time of curing and shrinkage of the sealing resin 3 or warpage due to thermal expansion at the time of use to be suppressed.

In FIG. 3, although each of the connecting conductors 62 is illustrated as a square, the shape of the connecting conductor 62 is not limited to the square and may be another shape. Each of the connecting conductors 62 may be in a linear shape in a similar manner to each of the magnetic member wall-shaped portions 52. However, in a case in which attention is focused on the relationship in length along the longitudinal direction of the strip-shaped region, the length of the shortest one out of the plurality of magnetic member wall-shaped portions 52 is longer than the length of the longest one out of the plurality of connecting conductors 62.

Also, since the length of each of the magnetic member wall-shaped portions is longer than the length of each of the connecting conductors, an influence of magnetism can be suppressed more efficiently while an influence of an electromagnetic wave is suppressed.

In FIG. 4, although a conductor pattern 18 is connected to a lower end of the magnetic member wall-shaped portion 52, the lower end of the magnetic member wall-shaped portion 52 is not required to be connected to a certain conductor pattern. Although the conductive layer 6 is preferably electrically connected to the ground electrode 14, the magnetic member 5 is not required to be electrically connected to the ground electrode 14. In order to serve as a magnetic shield, the magnetic member wall-shaped portion 52 is not necessarily required to fully separate the sealing resin 3 from the upper end to the lower end of the sealing resin 3 but is merely required to exist as a wall having a certain area. For example, the lower end of the magnetic member wall-shaped portion 52 may be located slightly above the lower end of the sealing resin 3. That is, there may be a gap between the lower end of the magnetic member wall-shaped portion 52 and the principal surface 1u of the substrate 1.

The reason for this is that the magnetic material functions as a magnetic shield in a mechanism of absorbing magnetism and converting the magnetism into heat. The conductor pattern 18 illustrated immediately below the magnetic member wall-shaped portion 52 in FIG. 4 may not exist.

A method for manufacturing the module according to the present embodiment is substantially similar to a method for manufacturing a module 102 described below in Embodiment 2. The module 101 can be obtained by appropriately changing the arrangement of the magnetic member wall-shaped portions 52 and the connecting conductors 62 in the manufacturing method described in Embodiment 2.

Embodiment 2

Figure 6:
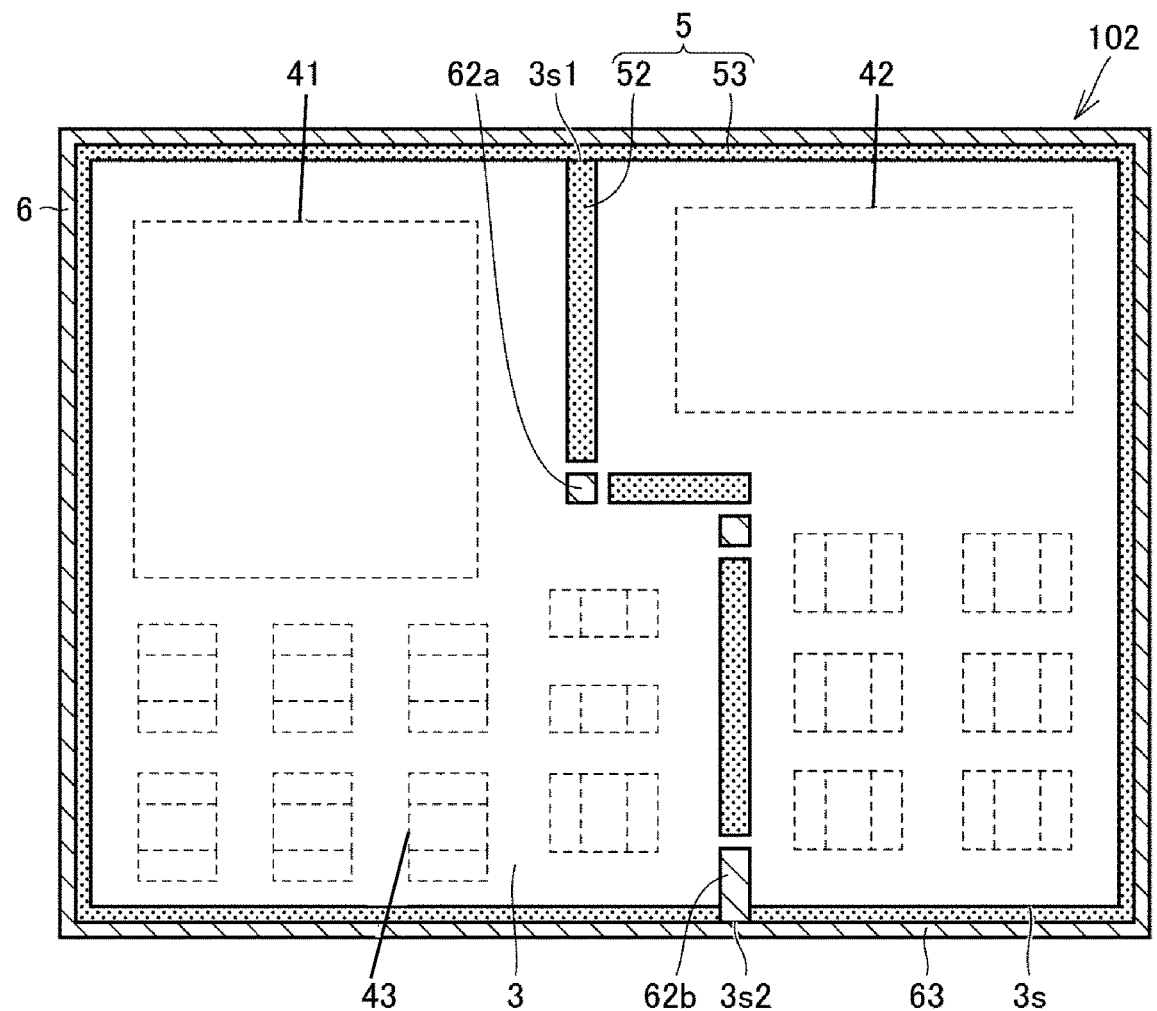
FIG. 6 is a plan view of a module according to Embodiment 2 based on the present disclosure.

A module according to Embodiment 2 based on the present disclosure will be described with reference to FIG. 6. A plan view of a module 102 according to the present embodiment is illustrated in FIG. 6. FIG. 6 corresponds to a view, viewed from an upper side, of a state in which an upper surface of the conductive layer 6 of the module 102 is removed. The configuration of the module 102 is basically similar to that of the module 101 described in Embodiment 1 but differs in the following points.

In the module 102, the sealing resin 3 includes a sealing resin side surface 3s.

A set of all the side surfaces on the outer periphery of the sealing resin 3 corresponds to the sealing resin side surface 3s. At least one of the plurality of magnetic member wall-shaped portions 52 is exposed from the sealing resin 3 at a first portion 3s1 of the sealing resin side surface 3s. At least one of the plurality of connecting conductors 62 is exposed from the sealing resin 3 at a second portion 3s2 of the sealing resin side surface 3s. The plurality of connecting conductors 62 include at least two types of connecting conductors. That is, the plurality of connecting conductors 62 include one or more connecting conductors 62a and one or more connecting conductors 62b. As illustrated in FIG. 6, the connecting conductor 62b is connected to a portion 63 of the electromagnetic shield. The connecting conductor 62b may extend in a wall shape as illustrated in FIG. 6.

In the present embodiment as well, a similar effect to that of Embodiment 1 can be obtained. Also, in the present embodiment, the magnetic member wall-shaped portion 52 and the connecting conductor 62 are arranged so as to reach the sealing resin side surface 3s at certain positions, the magnetic member wall-shaped portion 52 is connected to a portion 53 of the magnetic shield covering the side surface of the sealing resin 3 and the side surface of the substrate 1, and the connecting conductor 62 is connected to the portion 63 of the electromagnetic shield covering the side surface of the sealing resin 3. Accordingly, the shielding property can be improved.

(Manufacturing Method)

Figure 7:
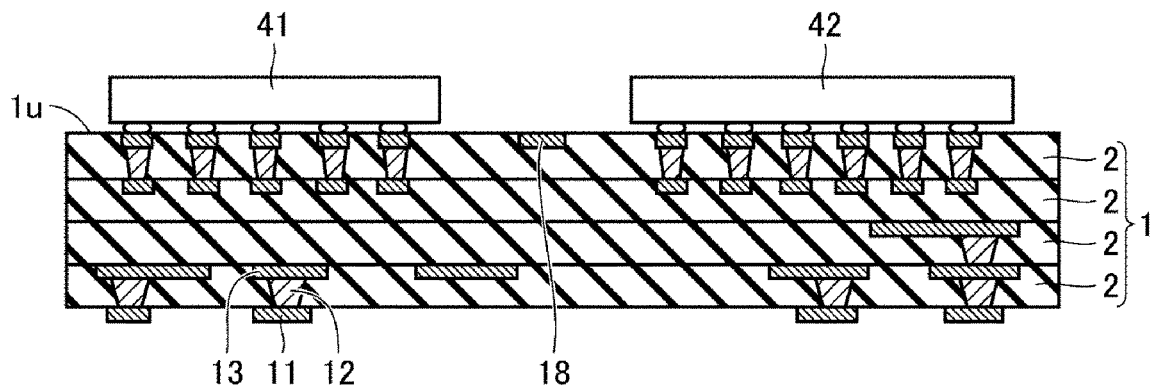
FIG. 7 is an explanatory view of a first process in a method for manufacturing the module according to Embodiment 2 based on the present disclosure.
Figure 8:
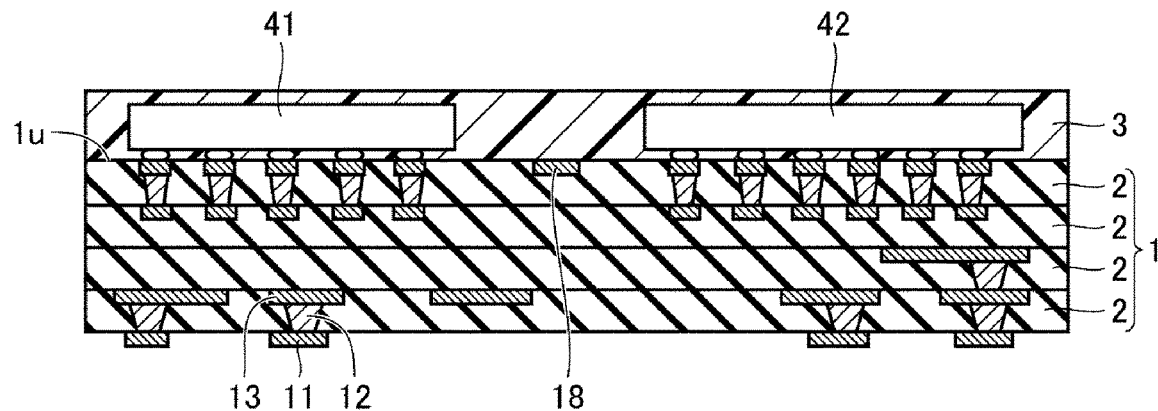
FIG. 8 is an explanatory view of a second process in the method for manufacturing the module according to Embodiment 2 based on the present disclosure.
Figure 9:
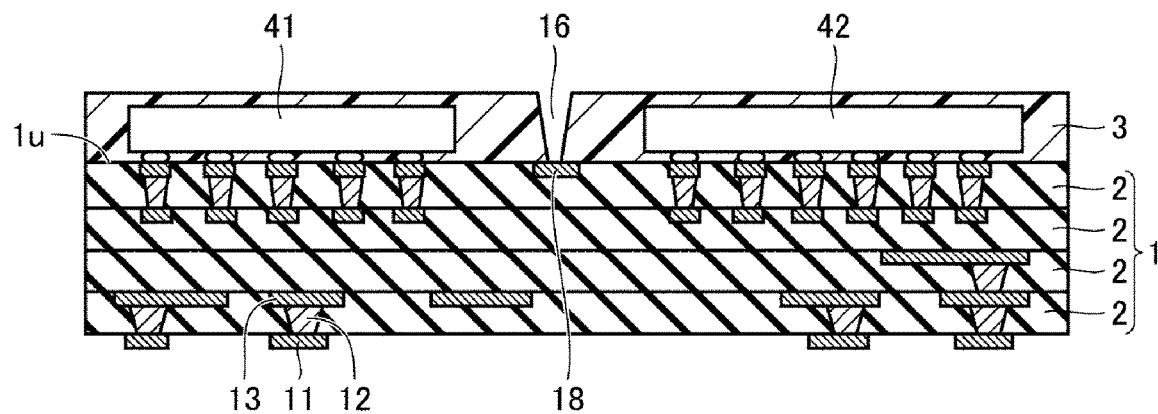
FIG. 9 is an explanatory view of a third process in the method for manufacturing the module according to Embodiment 2 based on the present disclosure.

The module 102 according to the present embodiment can be manufactured in the following manner. As illustrated in FIG. 7, the electronic components 41 and 42 are mounted on the principal surface 1u of the substrate 1. As illustrated in FIG. 8, the electronic components 41 and 42 are sealed by the sealing resin 3. As illustrated in FIG. 9, a trench 16 for a magnetic shield is formed in the sealing resin 3. To form the trench 16, laser processing may be used, for example.

Figure 10:
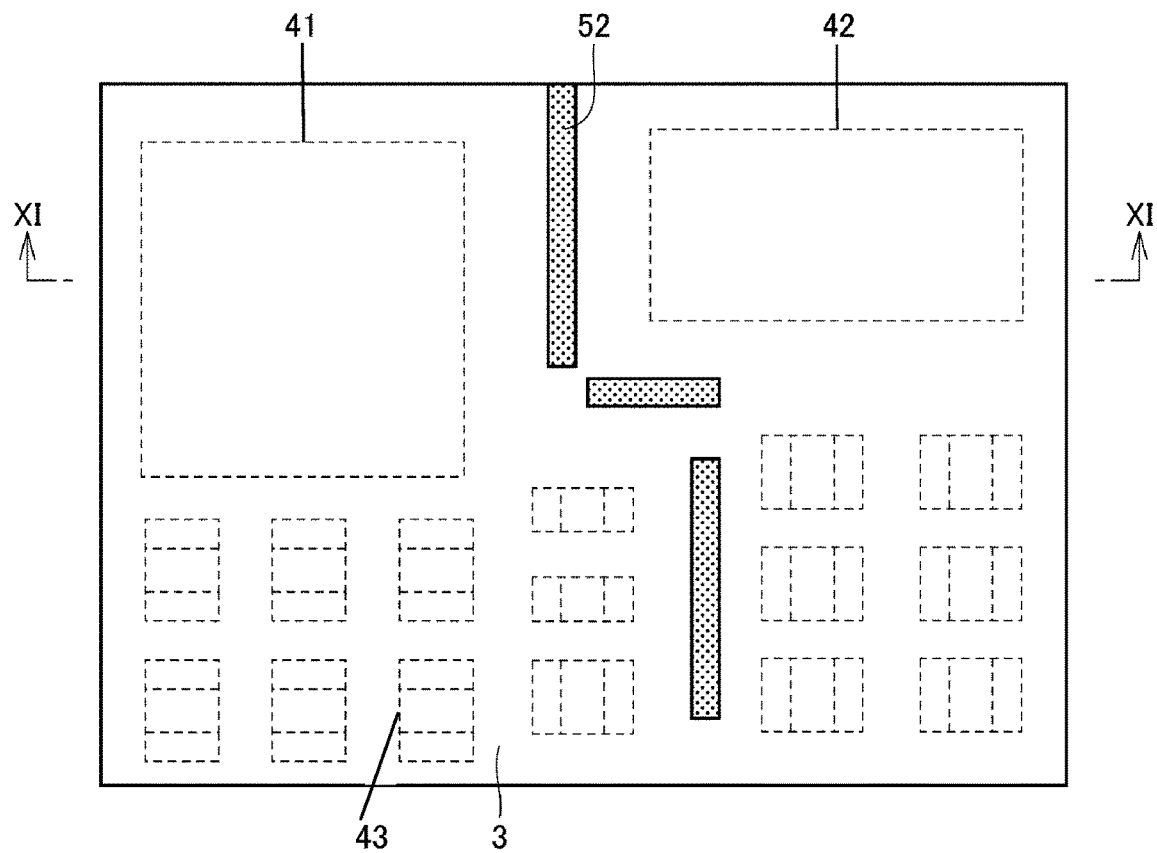
FIG. 10 is an explanatory view of a fourth process in the method for manufacturing the module according to Embodiment 2 based on the present disclosure.
Figure 11:
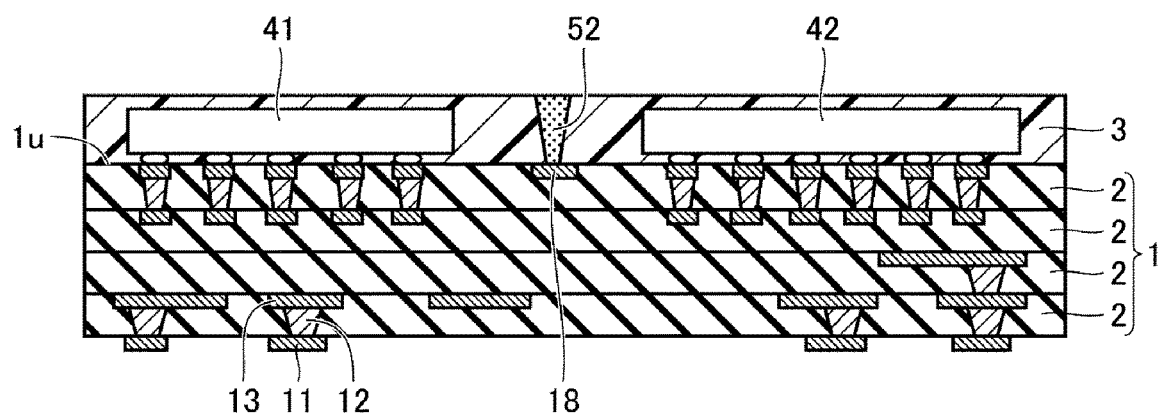
FIG. 11 is a sectional view taken along the line XI-XI in FIG. 10.

As illustrated in FIG. 10, the trench 16 is filled with a paste of a magnetic material. In this manner, the magnetic member wall-shaped portion 52 is formed. A sectional view taken along the line XI-XI in FIG. 10 is illustrated in FIG. 11. The magnetic member plate-shaped portion 51 is arranged on the upper surface of this structure. The portion 53 is arranged so as to cover the side surface of this structure. The magnetic member plate-shaped portion 51 and the portion 53 are formed with use of a magnetic material. The magnetic member plate-shaped portion 51 and the portion 53 may be formed integrally. This state is illustrated in FIG. 12.

Figure 12:
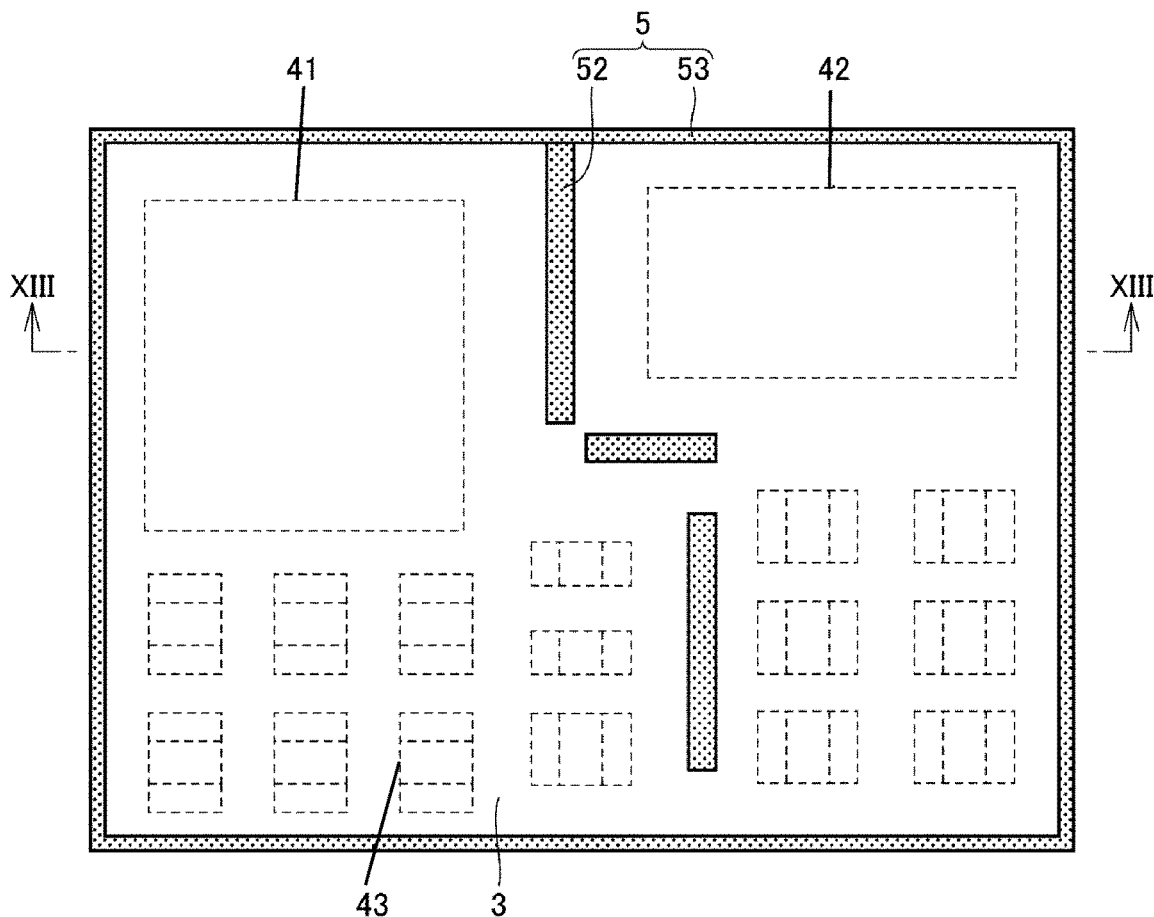
FIG. 12 is an explanatory view of a fifth process in the method for manufacturing the module according to Embodiment 2 based on the present disclosure.
Figure 13:
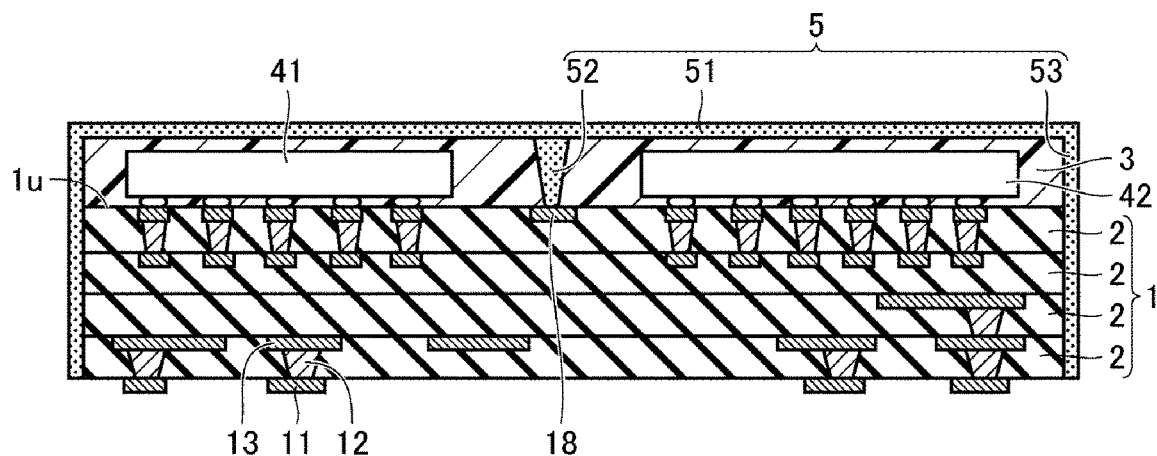
FIG. 13 is a sectional view taken along the line XIII-XIII in FIG. 12.

A sectional view taken along the line XIII-XIII in FIG. 12 is illustrated in FIG. 13.

A trench for an electromagnetic shield is formed in the sealing resin 3. This trench is formed to be shorter than the trench 16 for the magnetic shield. One end of the trench for the electromagnetic shield is formed so as to be exposed to the sealing resin side surface 3s.

Figure 14:
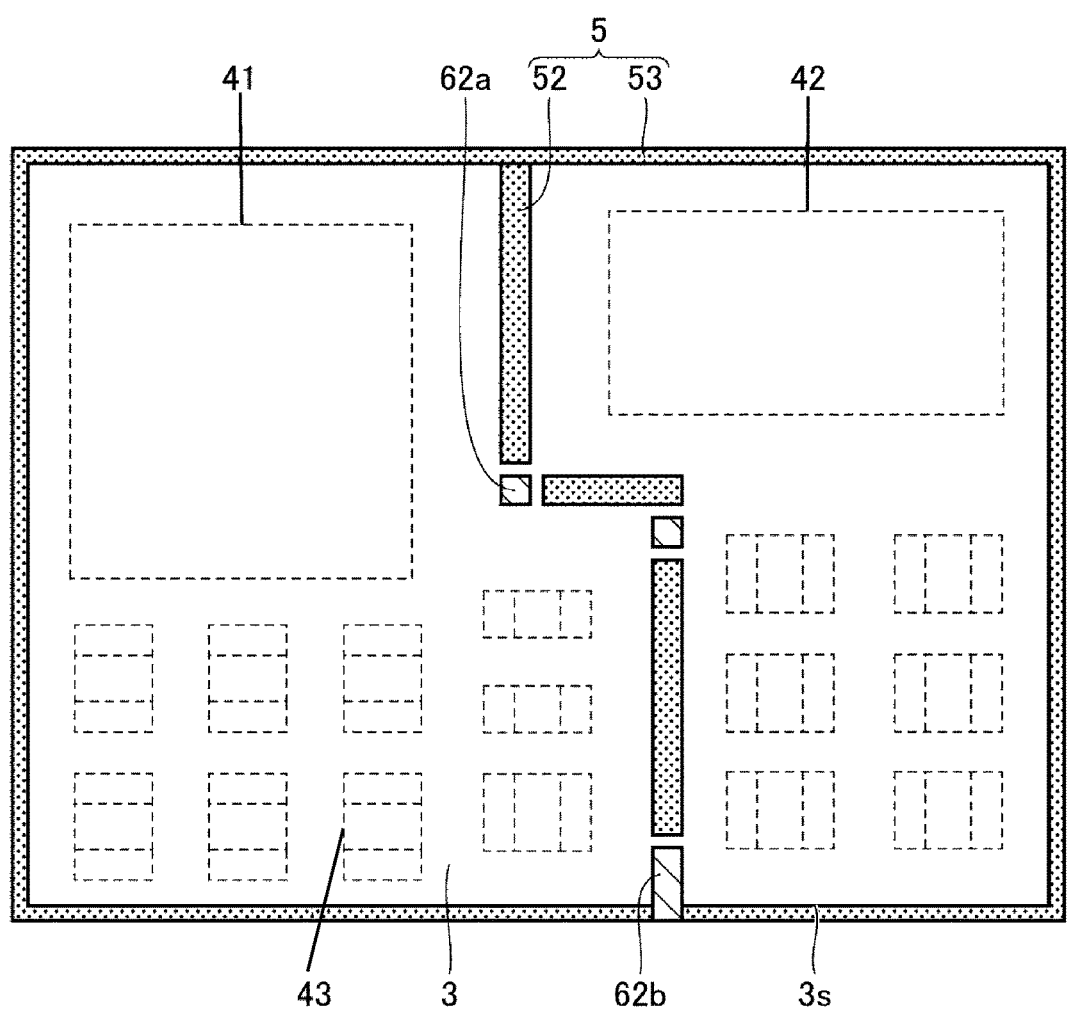
FIG. 14 is an explanatory view of a sixth process in the method for manufacturing the module according to Embodiment 2 based on the present disclosure.

Further, one end of the trench for the electromagnetic shield is formed so as to pass through the portion 53 of the magnetic member 5 and be exposed to the outer side surface thereof. The trench for the electromagnetic shield is filled with a paste of a conductive material. A state in which the processes to this point have been completed is illustrated in FIG. 14. Subsequently, a film of a conductive material is attached so as to cover the whole top surface and side surface by a method such as sputtering. That is, a portion 61 and the portion 63 are formed. In this manner, the portion 61, the connecting conductor 62, and the portion 63 are combined to cause the conductive layer 6 to be formed. The conductive layer 6 serves as the electromagnetic shield. In this manner, the module 102 illustrated in FIG. 6 is obtained.

Embodiment 3

Figure 15:
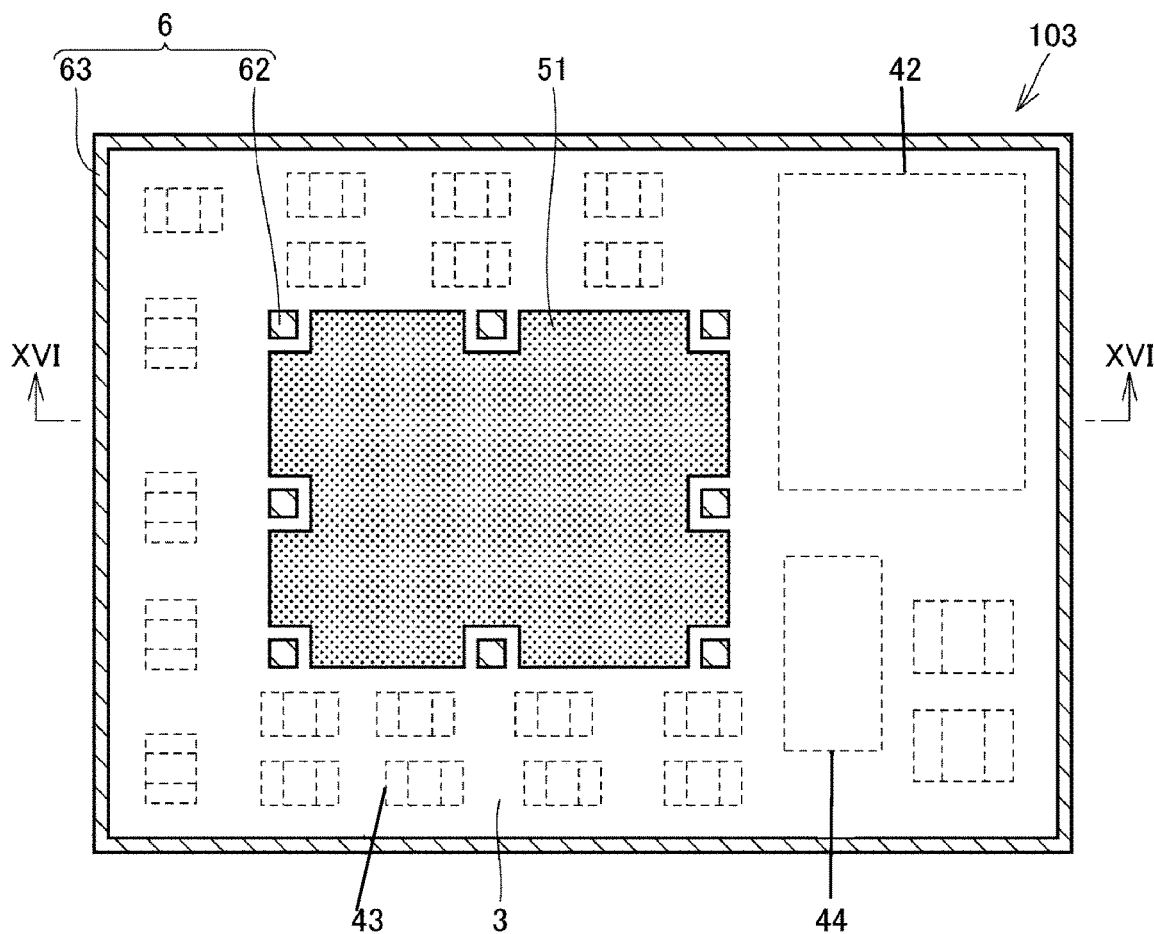
FIG. 15 is a first plan view of a module according to Embodiment 3 based on the present disclosure.
Figure 16:
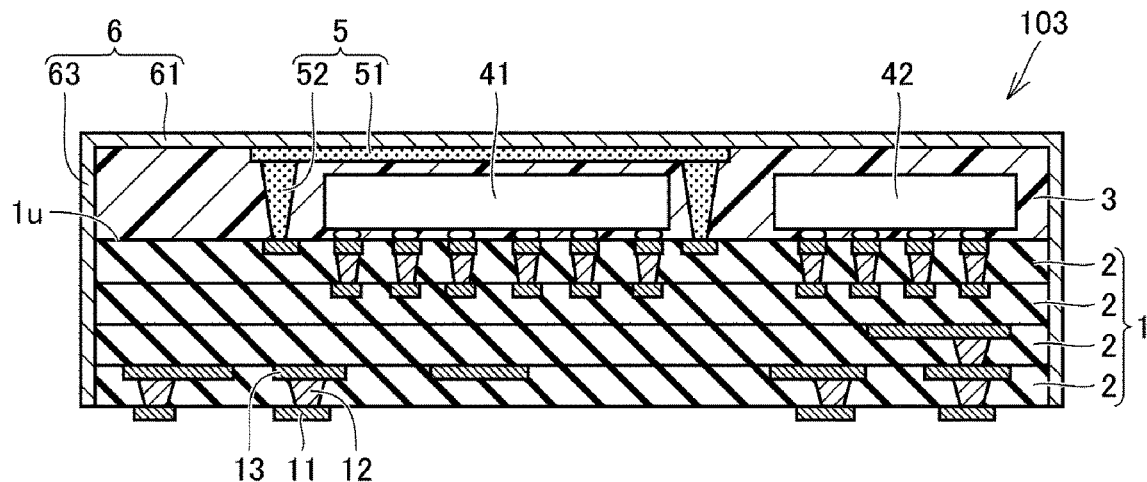
FIG. 16 is a sectional view taken along the line XVI-XVI in FIG. 15.
Figure 17:
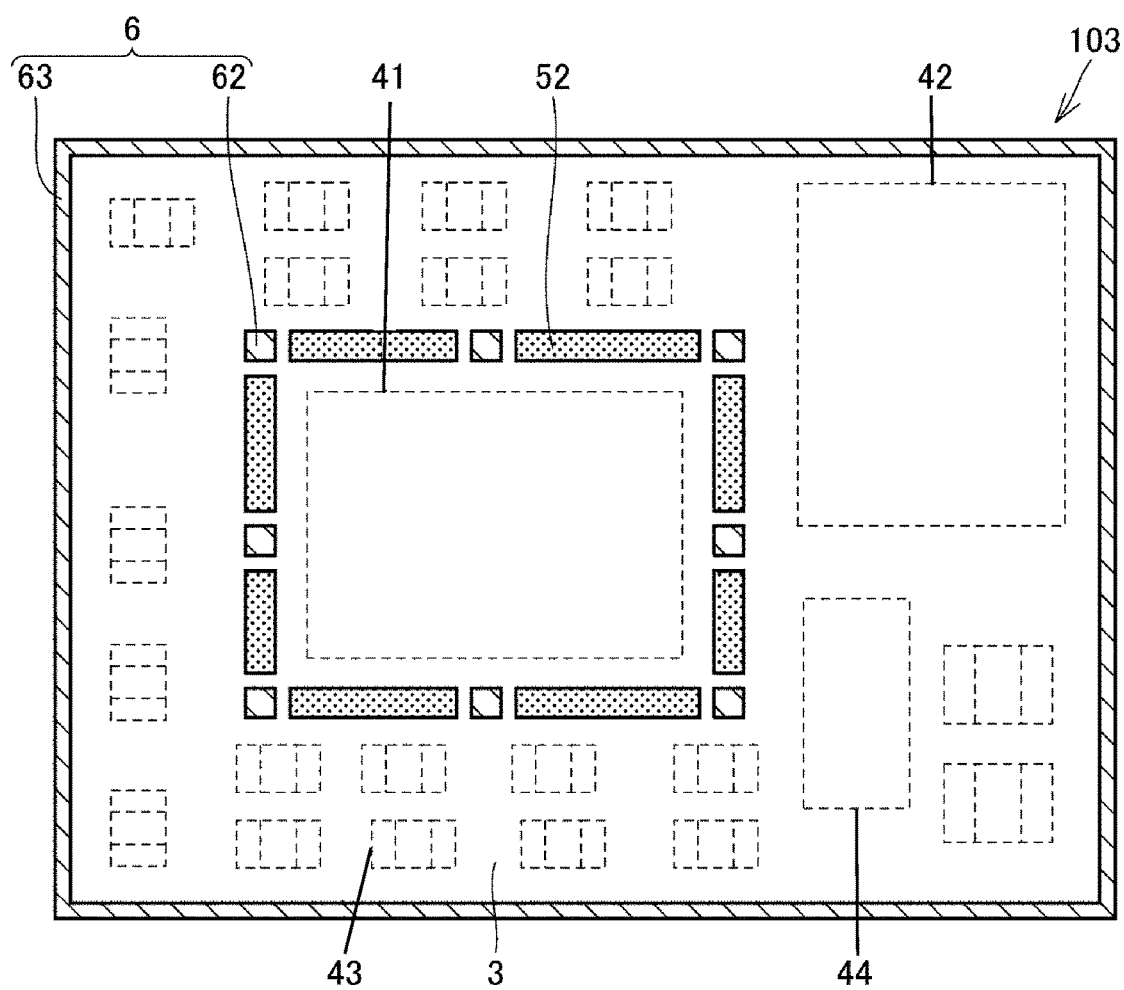
FIG. 17 is a second plan view of the module according to Embodiment 3 based on the present disclosure.

A module according to Embodiment 3 based on the present disclosure will be described with reference to FIGS. 15 to 17. A plan view of a module 103 according to the present embodiment is illustrated in FIG. 15. FIG. 15 corresponds to a view, viewed from an upper side, of a state in which an upper surface of the conductive layer 6 of the module 103 is removed. A sectional view taken along the line XVI-XVI in FIG. 15 is illustrated in FIG. 16. While, in FIG. 15, the state in which the upper surface of the conductive layer 6 is removed is viewed, FIG. 16 is a sectional view of a state in which the upper surface of the conductive layer 6 is present. A state in which the magnetic member plate-shaped portion 51 is removed in FIG. 15 is illustrated in FIG. 17. The configuration of the module 103 is basically similar to that of the module 101 described in Embodiment 1 but differs in the following points.

The magnetic member plate-shaped portion 51 covers only a small range as compared with the portion 61 of the conductive layer 6. The magnetic member plate-shaped portion 51 covers a region corresponding to the electronic component 41. The size of the magnetic member plate-shaped portion 51 is slightly larger than the size of the electronic component 41. The magnetic member wall-shaped portions 52 are arranged so as to surround the electronic component 41. The magnetic member wall-shaped portions 52 are spaced from the electronic component 41. The upper ends of the magnetic member wall-shaped portions 52 are connected to the magnetic member plate-shaped portion 51 in the vicinity of the outer periphery of the magnetic member plate-shaped portion 51.

The configuration of the module 103 according to the present embodiment can be summarized and expressed in the following manner.

In the module 103, the magnetic member plate-shaped portion 51 is interposed between the conductive layer 6 and the sealing resin 3. Also, when viewed in a direction perpendicular to the principal surface 1u, the area of the magnetic member plate-shaped portion 51 is smaller than the area of the conductive layer 6, and, in a first region surrounded by the conductive layer 6, a second region smaller than the first region and surrounded by the magnetic member 5 exists. The "first region" mentioned here refers to a whole region surrounded by the conductive layer 6 further on the upper side than the principal surface 1u of the substrate 1 in FIG. 16. The "second region" refers to a region surrounded by the magnetic member 5 further on the upper side than the principal surface 1u of the substrate 1 in FIG. 16. The configuration of the module 103 according to the present embodiment can also be regarded as a configuration in which a magnetically shielded small room is provided inside an electromagnetically shielded large room.

In this configuration as well, it can be stated that the plurality of magnetic member wall-shaped portions 52 and the plurality of connecting conductors 62 satisfy the conditions described in Embodiment 1. In the present embodiment as well, the length of any one of the magnetic member wall-shaped portions 52 is longer than the length of the adjacent connecting conductor 62.

In the present embodiment as well as in Embodiment 1, it is possible to satisfy both an electromagnetic shield and a magnetic shield while securing a mounting area. In the present embodiment, the electromagnetic shield in the first region can be achieved, and only a desired region which is a part of the first region can magnetically be shielded. In this manner, it is also possible to shield intensively and magnetically only a specific component.

Embodiment 4

Figure 18:
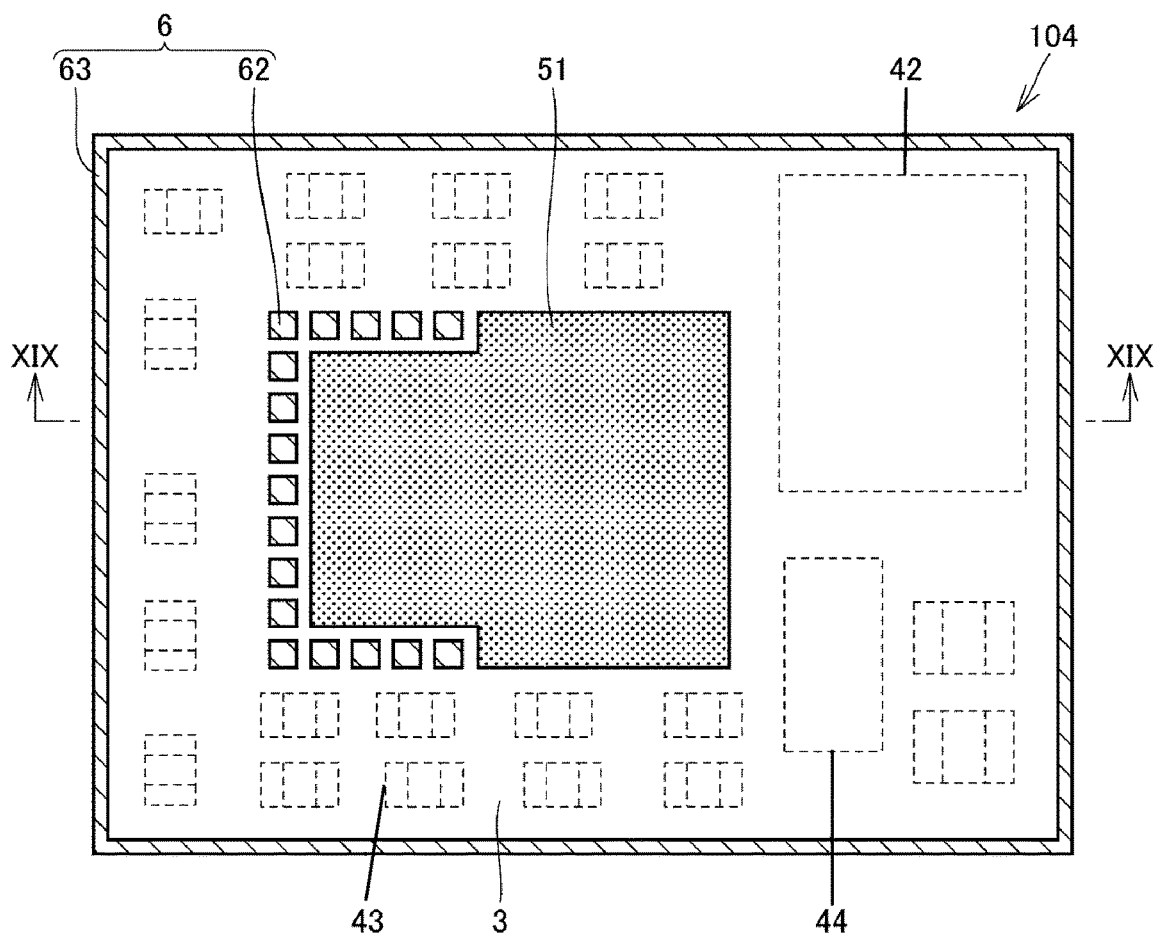
FIG. 18 is a first plan view of a module according to Embodiment 4 based on the present disclosure.
Figure 19:
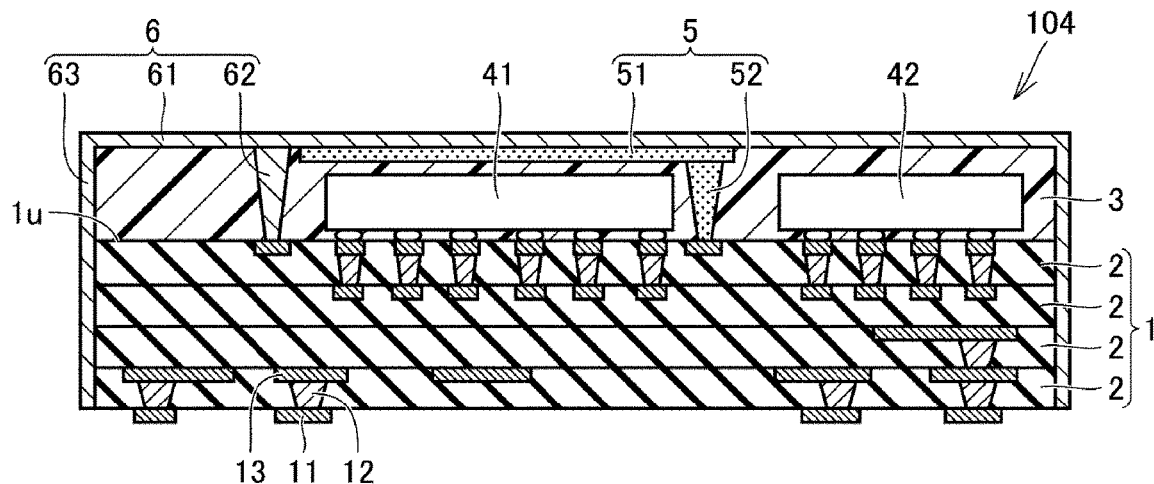
FIG. 19 is a sectional view taken along the line XIX-XIX in FIG. 18.
Figure 20:
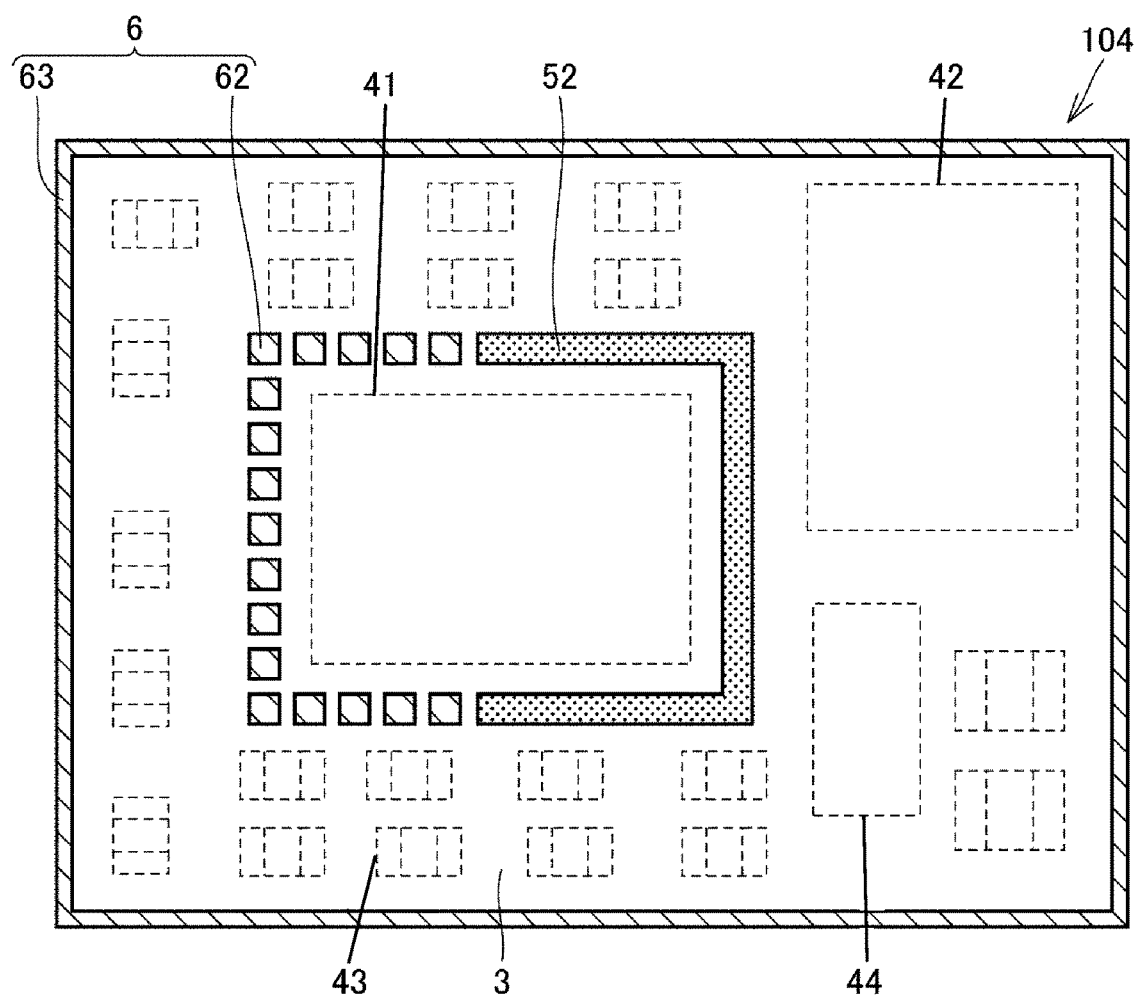
FIG. 20 is a second plan view of the module according to Embodiment 4 based on the present disclosure.

A module according to Embodiment 4 based on the present disclosure will be described with reference to FIGS. 18 to 20. A plan view of a module 104 according to the present embodiment is illustrated in FIG. 18. FIG. 18 corresponds to a view, viewed from an upper side, of a state in which an upper surface of the conductive layer 6 of the module 104 is removed. A sectional view taken along the line XIX-XIX in FIG. 18 is illustrated in FIG. 19. While, in FIG. 18, the state in which the upper surface of the conductive layer 6 is removed is viewed, FIG. 19 is a sectional view of a state in which the upper surface of the conductive layer 6 is present. A state in which the magnetic member plate-shaped portion 51 is removed in FIG. 18 is illustrated in FIG. 20. The configuration of the module 104 is basically similar to that of the module 103 described in Embodiment 3 but differs in the following points.

In the module 104 according to the present embodiment, the magnetic member 5 surrounds the whole upper surface of the electronic component 41 and about half of the side surface. As illustrated in FIG. 19, on the upper side of the electronic component 41, the magnetic member plate-shaped portion 51 and the portion 61 overlap with each other. That is, both an electromagnetic shield and a magnetic shield are provided on the upper surface of the electronic component 41. As illustrated in FIG. 20, on about the left half of the outer periphery of the electronic component 41 in a planar view, the connecting conductors 62 are arranged along the outer periphery of the electronic component 41. On about the other half, that is, on about the right half, the magnetic member wall-shaped portion 52 is arranged along the outer periphery of the electronic component 41. Therefore, it can be stated that a magnetic shield between the electronic component 41 and the outside is secured on the right half of the electronic component 41 in FIG. 20.

The configuration of the module 104 according to the present embodiment can also be regarded as a configuration in which an eave for a magnetic shield is provided inside an electromagnetically shielded large room.

In the present embodiment as well as in Embodiment 1, it is possible to satisfy both an electromagnetic shield and a magnetic shield while securing a mounting area. In the present embodiment, the electromagnetic shield in a first region can be achieved, and a desired portion of the electronic component 41 arranged in the first region can magnetically be shielded. In this manner, it is also possible to shield each desired portion intensively and magnetically shield in a specific component instead of each component.

In FIG. 20, for example, in a case in which it is not necessary to provide a magnetic shield that surrounds the whole electronic component 41, but in which it is desired to provide a magnetic shield between the electronic component 41 and the electronic components 42 and 44, providing the magnetic member wall-shaped portion 52 as illustrated in FIG. 20 can save waste and is preferable.

Figure 21:
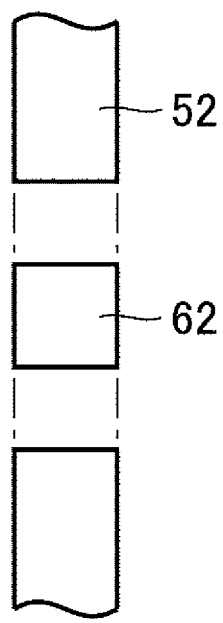
FIG. 21 is an explanatory view of a first example in which a connecting conductor is arranged so as to overlap with a strip-shaped region.

The concept of the virtual "strip-shaped region" described in the above embodiments will be described further in detail. For example, the strip-shaped region as illustrated in FIG. 21 is raised as a simple example. In FIG. 21, the magnetic member wall-shaped portions 52 exist on the upper and lower sides, respectively. Each of the magnetic member wall-shaped portions 52 has a certain width. A region extending with the same width from either the upper or lower magnetic member wall-shaped portion 52 is assumed. In other words, extension lines are drawn in the longitudinal direction from the left-hand side and the right-hand side of the magnetic member wall-shaped portion 52. That is, two extension lines as illustrated by the dashed-dotted lines are assumed. The region residing between the two dashed-dotted lines is the strip-shaped region. In the example illustrated in FIG. 21, the connecting conductor 62 is arranged so as to fit exactly in the strip-shaped region.

Figure 22:
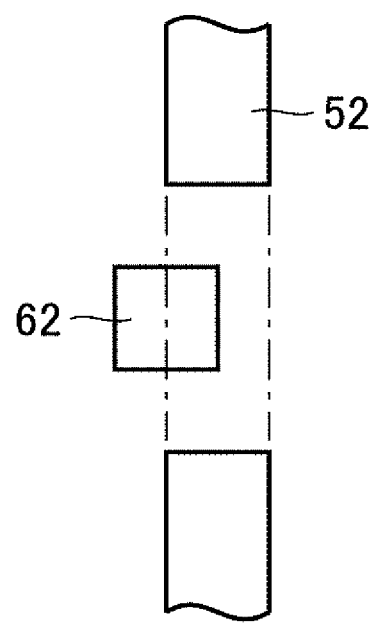
FIG. 22 is an explanatory view of a second example in which the connecting conductor is arranged so as to overlap with the strip-shaped region.

The connecting conductor 62 does not necessarily fit in the strip-shaped region properly as illustrated in FIG. 21 and may be located at a slightly displaced position. For example, the example illustrated in FIG. 22 may be employed. In FIG. 22, the connecting conductor 62 protrudes from the strip-shaped region but does not fully deviate, and a part of the connecting conductor 62 overlaps with the strip-shaped region. Such arrangement may be employed.

Although FIGS. 21 and 22 illustrate examples in which two magnetic member wall-shaped portions 52 are arranged in a straight line, the two magnetic member wall-shaped portions 52 may not be arranged in a straight line but may be arranged in a curved line. In this case, the extension lines may be assumed to be curved lines.

Figure 23:
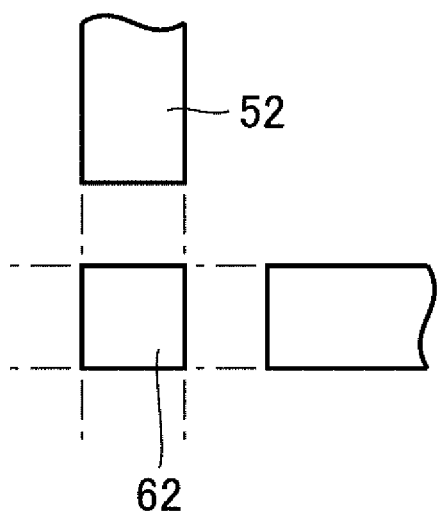
FIG. 23 is an explanatory view of a third example in which the connecting conductor is arranged so as to overlap with the strip-shaped region.
Figure 24:
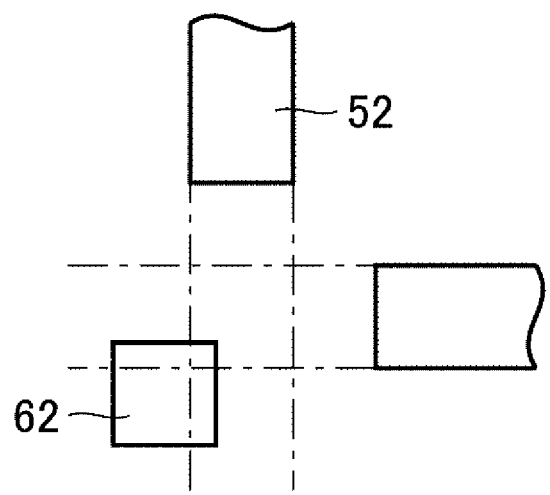
FIG. 24 is an explanatory view of a fourth example in which the connecting conductor is arranged so as to overlap with the strip-shaped region.

The two magnetic member wall-shaped portions 52 may extend in different directions. FIG. 23 illustrates an example in which the two magnetic member wall-shaped portions 52 extend in directions perpendicular to each other. As illustrated by the dashed-dotted lines, extension lines extend from each of the two magnetic member wall-shaped portions 52. As a result, one pair consisting of two dashed-dotted lines intersects with the other pair consisting of two dashed-dotted lines at right angles. A region surrounded by the four dashed-dotted lines appears as a substantially square region. This substantially square region is hereinbelow referred to as an "overlapping region". In the example illustrated in FIG. 23, the connecting conductor 62 is arranged so as to exactly coincide with the overlapping region. In FIG. 23, the strip-shaped region includes a portion extending downward from the upper magnetic member wall-shaped portion 52 to reach the overlapping region and a portion extending from the overlapping region toward the right side. That is, the strip-shaped region is virtualized as an L-shaped figure with the overlapping region as the apex. In FIG. 23, a region further on the left side than the overlapping region and a region further on the lower side than the overlapping region are not included in the strip-shaped region. FIG. 24 illustrates an example in which the connecting conductor 62 is slightly displaced. Even in such arrangement, a part of the connecting conductor 62 overlaps with the overlapping region. That is, a part of the connecting conductor 62 overlaps with the strip-shaped region. The positional relationship as illustrated in FIG. 24 may be employed.

Embodiment 5

Figure 25:
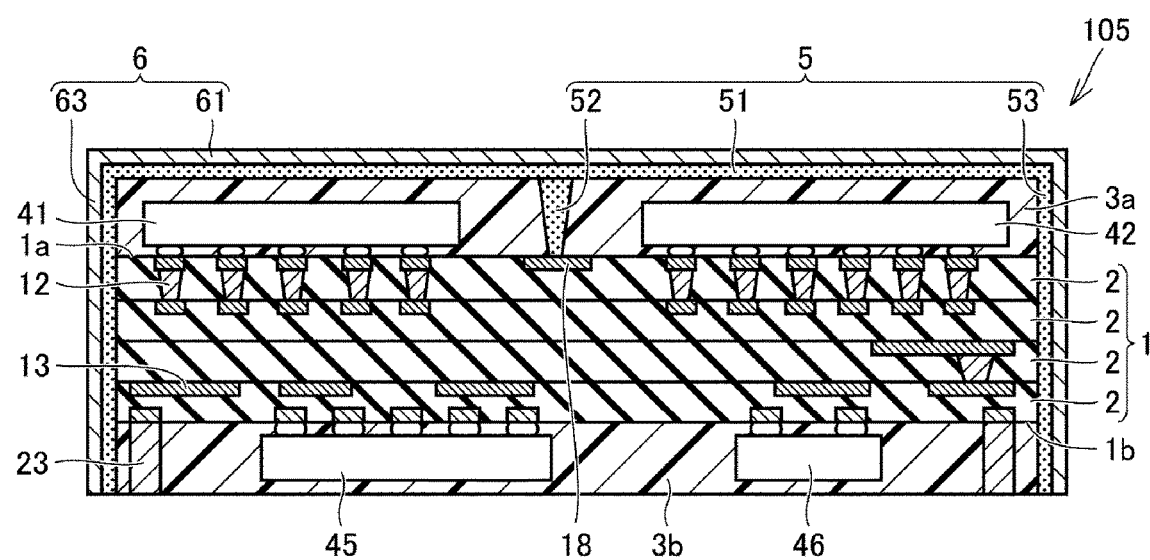
FIG. 25 is a sectional view of a module according to Embodiment 5 based on the present disclosure.

A module according to Embodiment 5 based on the present disclosure will be described with reference to FIG. 25. A sectional view of a module 105 according to the present embodiment is illustrated in FIG. 25. The module 105 according to the present embodiment is similar to the module 101 described in Embodiment 1 in terms of the basic configuration but has the following configuration.

The module 105 has a double-sided mounting structure. That is, in the module 105, the substrate 1 includes a principal surface 1a and a second principal surface 1b as a surface opposite to the principal surface 1a. The module 105 is provided with a second electronic component arranged on the second principal surface 1b. That is, in the module 105, electronic components 45 and 46 are mounted on the second principal surface 1b, for example. As the "second electronic component", at least one electronic component may be arranged. The electronic components 41 and 42 are sealed with a sealing resin 3a. The electronic components 45 and 46 are sealed with a second sealing resin 3b. The electronic components 45 and 46 may be exposed from the second sealing resin 3b. The module 105 is provided with a columnar conductor 23 as an external terminal provided on the second principal surface 1b. The columnar conductor 23 penetrates the second sealing resin 3b. In the example illustrated here, the lower surface of the columnar conductor 23 is exposed to the outside. The columnar conductor 23 may be either a convexity electrode or a metal pin. The columnar conductor 23 may be formed by plating. A solder bump may be connected to the lower end of the columnar conductor 23.

The configuration of the external terminal illustrated here is illustrative only and is not always the case. For example, a solder bump may be used instead of the columnar conductor 23.

Note that some of the above-described embodiments may appropriately be combined and employed. For example, in any of the configurations in Embodiments 2 to 4, a double-sided mounting structure as in Embodiment 5 may be employed.

Note that the embodiments disclosed here are illustrative only and are not limitative in all respects. The scope of the present disclosure is defined by the claims, and the present disclosure includes any modifications within the meaning and scope equivalent to those of the claims.

1: Substrate
1a, 1u: Principal surface
1b: Second principal surface
2: Insulating layer
3, 3a: Sealing resin
3b: Second sealing resin
3s: Sealing resin side surface
3s1: First portion
3s2: Second portion
5: Magnetic member
6: Conductive layer
11: External connection electrode
12: Conductor via
13: Internal conductor pattern
14: Ground electrode
16: Trench
18: Conductor pattern
23: Columnar conductor
41, 42, 43, 45, 46: Electronic component
51: Magnetic member plate-shaped portion
52: Magnetic member wall-shaped portion
53: Portion (of magnetic member covering side surface of sealing resin and side surface of substrate)
61: Portion (of conductive layer covering upper surface of sealing resin)

62, 62a, 62b: Connecting conductor
63: Portion (of conductive layer covering side surface of sealing resin)
101, 102, 103, 104: Module

The invention claimed is:

1. A module comprising:
a substrate including a principal surface;
a plurality of electronic components arranged on the principal surface;
a sealing resin covering the principal surface and the plurality of electronic components;
a ground electrode arranged on the principal surface;
a conductive layer covering the sealing resin; and
a magnetic member,
wherein the conductive layer is electrically connected to the ground electrode by a plurality of connecting conductors arranged so as to penetrate the sealing resin,
wherein the magnetic member includes a magnetic member plate-shaped portion arranged so as to cover the sealing resin and a plurality of magnetic member wall-shaped portions intermittently arranged in a wall shape between any of the plurality of electronic components in the sealing resin,
wherein, when viewed in a direction perpendicular to the principal surface, each of the plurality of connecting conductors includes a portion arranged so as to at least partially overlap with either a strip-shaped region virtualized on an extension of the single magnetic member wall-shaped portion or the plurality of magnetic member wall-shaped portions, and
wherein a length of the single magnetic member wall-shaped portion or any one of the plurality of magnetic member wall-shaped portions is longer than a length of each of the connecting conductors.

2. The module according to claim 1, wherein the sealing resin includes a sealing resin side surface,
wherein at least one of the plurality of magnetic member wall-shaped portions is exposed from the sealing resin at a first portion of the sealing resin side surface, and
wherein at least one of the plurality of connecting conductors is exposed from the sealing resin at a second portion of the sealing resin side surface.

3. The module according to claim 1, wherein the magnetic member plate-shaped portion is interposed between the conductive layer and the sealing resin, and wherein when viewed in a direction perpendicular to the principal surface, an area of the magnetic member plate-shaped portion is smaller than an area of the conductive layer, and wherein, in a first region surrounded by the conductive layer, a second region smaller than the first region and surrounded by the magnetic member exists.

4. The module according to claim 1, wherein the magnetic member contains an alloy, a ferrite material or a permalloy plated material, wherein the alloy includes an Fe—Co-based alloy and an Fe—Ni-based alloy, and the ferrite material includes NiZn and MnZn.

5. The module according to claim 1, wherein the substrate further includes a second principal surface as a surface opposite to the principal surface,
the module comprising:
a second electronic component arranged on the second principal surface;
a second sealing resin covering the second principal surface and the second electronic component; and
an external terminal provided on the second principal surface.

6. The module according to claim 2, wherein the magnetic member plate-shaped portion is interposed between the conductive layer and the sealing resin, and wherein when viewed in a direction perpendicular to the principal surface, an area of the magnetic member plate-shaped portion is smaller than an area of the conductive layer, and wherein, in a first region surrounded by the conductive layer, a second region smaller than the first region and surrounded by the magnetic member exists.

7. The module according to claim 2, wherein the magnetic member contains an alloy, a ferrite material or a permalloy plated material, wherein the alloy includes an Fe—Co-based alloy and an Fe—Ni-based alloy, and the ferrite material includes NiZn and MnZn.

8. The module according to claim 3, wherein the magnetic member contains an alloy, a ferrite material or a permalloy plated material, wherein the alloy includes an Fe—Co-based alloy and an Fe—Ni-based alloy, and the ferrite material includes NiZn and MnZn.

9. The module according to claim 2, wherein the substrate further includes a second principal surface as a surface opposite to the principal surface,
the module comprising:
a second electronic component arranged on the second principal surface;
a second sealing resin covering the second principal surface and the second electronic component; and
an external terminal provided on the second principal surface.

10. The module according to claim 3, wherein the substrate further includes a second principal surface as a surface opposite to the principal surface,
the module comprising:
a second electronic component arranged on the second principal surface;
a second sealing resin covering the second principal surface and the second electronic component; and
an external terminal provided on the second principal surface.

11. The module according to claim 4, wherein the substrate further includes a second principal surface as a surface opposite to the principal surface,
the module comprising:
a second electronic component arranged on the second principal surface;
a second sealing resin covering the second principal surface and the second electronic component; and
an external terminal provided on the second principal surface.

* * * * *